(12) United States Patent  
Ko

(10) Patent No.: US 9,252,230 B2  
(45) Date of Patent: Feb. 2, 2016

(54) SEMICONDUCTOR DEVICE AND METHOD OF MANUFACTURING THE SAME

(71) Applicant: SK hynix Inc., Icheon-si, Gyeonggi-do (KR)

(72) Inventor: Min Sung Ko, Icheon-si (KR)

(73) Assignee: SK Hynix Inc., Gyeonggi-do (KR)

(*) Notice: Subject to any disclaimer, the term of this patent is extended or adjusted under 35 U.S.C. 154(b) by 122 days.

(21) Appl. No.: 14/055,446

(22) Filed: Oct. 16, 2013

(65) Prior Publication Data

US 2015/0008508 A1    Jan. 8, 2015

(30) Foreign Application Priority Data

Jul. 3, 2013 (KR) .................. 10-2013-0077930

(51) Int. Cl.
*H01L 29/51* (2006.01)
*H01L 29/66* (2006.01)
*H01L 27/115* (2006.01)
*H01L 21/28* (2006.01)

(52) U.S. Cl.
CPC ........ *H01L 29/513* (2013.01); *H01L 27/11582* (2013.01); *H01L 29/66833* (2013.01); *H01L 21/28282* (2013.01)

(58) Field of Classification Search
CPC ............ H01L 29/511; H01L 27/11578; H01L 21/28282
USPC .......................................... 257/325; 438/591
See application file for complete search history.

(56) References Cited

U.S. PATENT DOCUMENTS 7,986,556 B2 * 7/2011 Lue .......................... 365/185.05
2013/0127011 A1 * 5/2013 Higashitani et al. .......... 257/532

FOREIGN PATENT DOCUMENTS

KR    1020120111375 A    10/2012
KR    1020130005435 A     1/2013

* cited by examiner

*Primary Examiner* — Matthew W Such
*Assistant Examiner* — Warren H Kilpatrick
(74) *Attorney, Agent, or Firm* — William Park & Associates Ltd.

(57) ABSTRACT

A semiconductor device and a method of manufacturing the same are provided. The device includes insulating patterns and conductive patterns stacked alternately, a channel layer formed through the insulating patterns and the conductive patterns, a tunnel insulating layer formed to surround sidewalls of the channel layer, and a charge storage layer formed to surround the tunnel insulating layer. An interfacial surface of the tunnel insulating layer in contact with the charge storage layer includes a thermal oxide layer.

15 Claims, 5 Drawing Sheets

SEMICONDUCTOR DEVICE AND METHOD OF MANUFACTURING THE SAME

CROSS-REFERENCE TO RELATED APPLICATION

The present application claims priority under 35 U.S.C. §119(a) to Korean Patent Application No. 10-2013-0077930, filed on Jul. 3, 2013, in the Korean Intellectual Property Office, which is incorporated herein by reference in its entirety.

BACKGROUND

1. Technical Field

The present invention generally relates to a semiconductor device. More specifically, the present invention relates to a semiconductor device and a method of manufacturing the same.

2. Discussion of Related Art

With the rapid development of an industry related to memory devices, such as nonvolatile memory devices, the demand for highly integrated memory devices has increased. Conventionally, the integration density of semiconductor devices within a predetermined area has increased by reducing the size of memory cells 2-dimensionally arranged on a semiconductor substrate. However, there is a physical limit in reducing the size of the memory cells. Accordingly, a method of increasing the integration density of memory devices by 3-dimensionally arranging memory cells on a semiconductor substrate has lately been proposed. When the memory cells are 3-dimensionally arranged as described above, the area of the semiconductor substrate may be efficiently used, and the integration density of the memory devices may be improved as compared with a case in which memory cells are 2-dimensionally arranged. In particular, when a 3-dimensional NAND flash memory device is embodied by 3-dimensionally arranging memory strings of a NAND flash memory device, which is advantageous to increase integration density, it is expected that the integration density of the memory devices will be maximized. Therefore, it is necessary to develop a 3-dimensional semiconductor device.

SUMMARY

The present invention is directed to a semiconductor device having a 3-dimensional structure and a method of manufacturing the same, which may improve the film quality of a tunnel insulating layer of a 3-dimensional semiconductor device.

A 3-dimensional semiconductor device may include word lines stacked on a substrate and spaced apart from one another, a channel layer formed through the word lines in a direction vertical to the substrate, a tunnel insulating layer configured to surround the channel layer, a charge storage layer formed to surround the tunnel insulating layer, and a blocking insulating layer formed to surround the charge storage layer. A memory cell traps charges in a portion of the charge storage layer disposed at an intersection between the word lines and the channel layer to store data.

Thus, aspects of the present invention may provide for a semiconductor device including: insulating patterns and conductive patterns stacked alternately, a channel layer formed through the insulating patterns and the conductive patterns, a tunnel insulating layer formed to surround sidewalls of the channel layer, and a charge storage layer formed to surround the tunnel insulating layer. A surface of the tunnel insulating layer in contact with the charge storage layer is formed of a thermal oxide layer.

Other aspects of the present invention provide for a semiconductor device including: insulating patterns and conductive patterns stacked alternately, a channel layer formed through the insulating patterns and the conductive patterns, a first tunnel insulating layer formed to surround sidewalls of the channel layer, a second tunnel insulating layer formed to surround the first tunnel insulating layer, and a charge storage layer formed to surround the second tunnel insulating layer.

Other aspects of the present invention provide for a method of manufacturing a semiconductor device. The method includes alternately stacking first material layers and second material layers, forming holes through the first material layers and the second material layers, and forming a charge storage layer, a tunnel insulating layer including a multilayered structure, and a channel layer within each of the holes.

BRIEF DESCRIPTION OF THE DRAWINGS

The above and other features and advantages of the present invention will become more apparent to those of ordinary skill in the art by describing in detail various examples of embodiments thereof with reference to the attached drawings in which.

DETAILED DESCRIPTION

Figure 1:
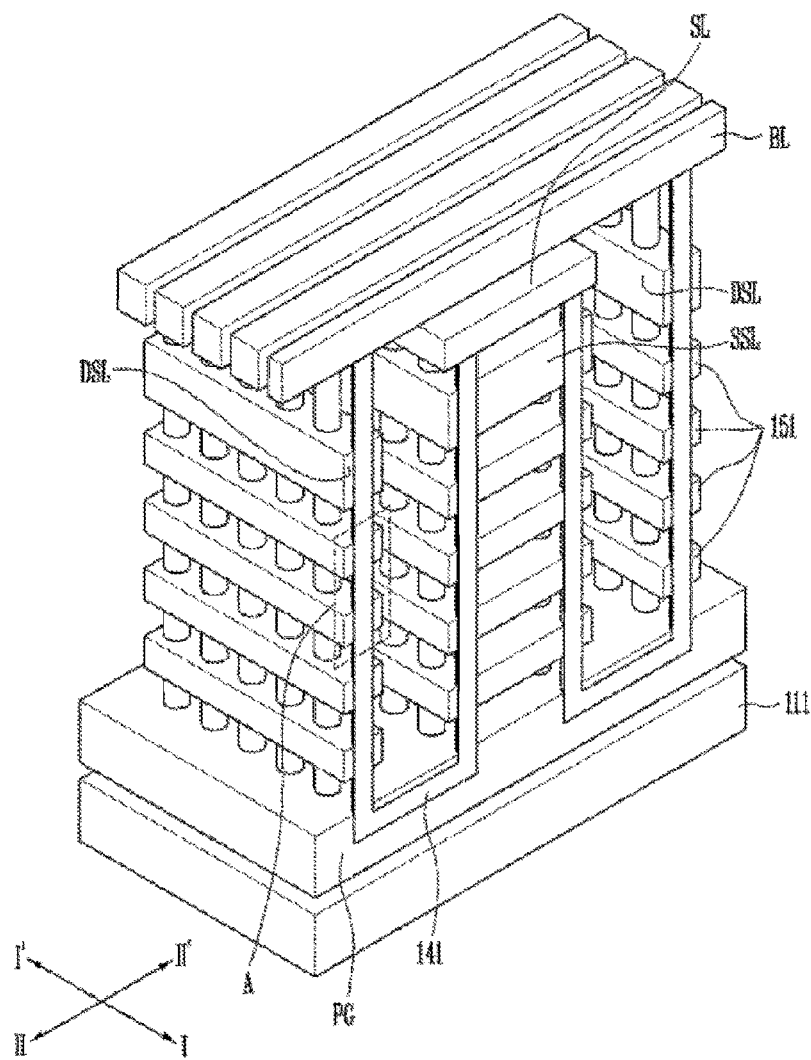
FIG. 1 is a perspective view of a semiconductor device according to an example of an embodiment of the present invention.

The present invention will be described more fully hereinafter with reference to the accompanying drawings, in which various examples of embodiments of the invention are shown. This invention may, however, be embodied in different forms and should not be construed as limited to the embodiments set forth herein.

In the drawings, the thicknesses of layers and regions may be exaggerated compared to actual physical thicknesses for clarity. Descriptions of well-known components and processing techniques are omitted so as not to unnecessarily obscure the embodiments of the present invention. It should be noted that the same reference numerals may be used to denote the same elements even if they are described in different drawings.

FIG. 1 is a perspective view of a semiconductor device according to an example of an embodiment of the present invention. In FIG. 1, the illustration of an insulating layer is omitted for brevity.

Referring to FIG. 1, the semiconductor device according to the present invention may include a pipe gate PG, a plurality of conductive patterns 151, at least one drain selection line DSL and at least one source selection line SSL, which may be stacked on a substrate 111, and a U-shaped through structure 141 formed through the plurality of conductive patterns 151 and the pipe gate PG.

Here, the plurality of conductive patterns 151, the drain selection line DSL, and the source selection line SSL may be stacked to surround the through structure 141. Also, the U-shaped through structure 141 may be connected to bit lines BL and a source line SL.

In the above-described structure, a source selection transistor is formed at an intersection between the source selection line SSL and the through structure 141, and memory cells are formed at intersections between the plurality of conductive patterns 151 and the through structure 141. A pipe transistor may be formed at an intersection between the pipe gate PG and the through structure 141, and a drain selection transistor may be formed at an intersection between the through structure 141 and the drain selection line DSL.

Accordingly, the drain selection transistor, a plurality of memory cells, the pipe transistor, the plurality of memory cells, and the source selection transistor, which may be connected in series, may constitute one string, and strings may be arranged in a U shape.

Although embodiments of the present invention describe an example in which the strings are arranged in a U shape, a common source line may be formed on a semiconductor substrate 111, bit lines may be formed on the common source line, and a straight string may be formed between the bit lines and the common source line, so that a semiconductor device having the straight string can be formed.

Figure 2:
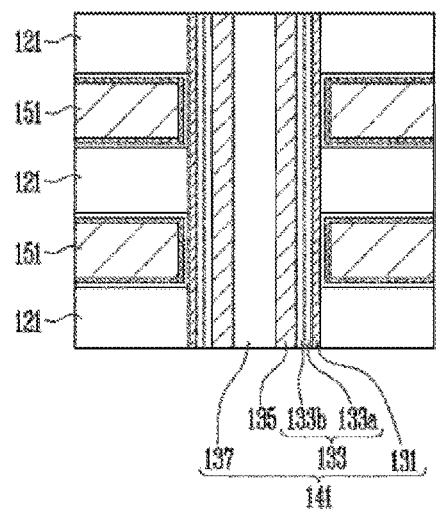
FIG. 2 is an enlarged cross-sectional view of region A shown in FIG. 1, which illustrates a through structure.

FIG. 2 is an enlarged cross-sectional view of region A shown in FIG. 1, which illustrates the through structure 141.

Referring to FIG. 2, the through structure 141 may include a channel layer 135 formed through insulating patterns 121 and the conductive patterns 151 stacked alternately, a tunnel insulating layer 133 having a multilayered structure to surround sidewalls of the channel layer 135, and a charge storage layer 131 configured to surround the tunnel insulating layer 133 having the multilayered structure. The channel layer 135 may be formed of a semiconductor layer and penetrate the insulating patterns 121 and the conductive patterns 151, which are stacked alternately, as shown in FIG. 2. Also, a central region of the channel layer 135 may be filled with an insulating layer 137. Alternatively, although not shown, not only the surface of the channel layer 135 but also the central region of the channel layer 135 may be formed of a semiconductor layer. The tunnel insulating layer 133 having the multilayered structure may include a first tunnel insulating layer 133a and a second tunnel insulating layer 133b. More specifically, the first tunnel insulating layer 133a in contact with the charge storage layer 131 may be formed of a thermal oxide layer, and the second tunnel insulating layer 133b formed between the first tunnel insulating layer 133a and the charge storage layer 131 may be formed of at least one of a radical oxide layer, a dry oxide layer, and a wet oxide layer. The charge storage layer 131 may be formed of a nitride layer.

As in the present invention, when the tunnel insulating layer 133 has a multilayered structure including the first tunnel insulating layer 133a and the second tunnel insulating layer 133b, the first tunnel insulating layer 133a in contact with the charge storage layer 131 is formed of a thermal oxide layer, and the remaining second tunnel insulating layer 133b is formed of at least one of a radical oxide layer, a dry oxide layer, and a wet oxide layer, cycling characteristics of the tunnel insulating layer 133 may be improved due to the second tunnel insulating layer 133b, and the first tunnel insulating layer 133a, which includes the thermal oxide layer, may prevent a SiON layer, which is a shallow trap layer, from being formed at an interface between the first tunnel insulating layer 133a and the charge storage layer 131.

FIGS. 3A through 3E are cross-sectional views illustrating a method of manufacturing the semiconductor device shown in FIG. 1.

Figure 3A:
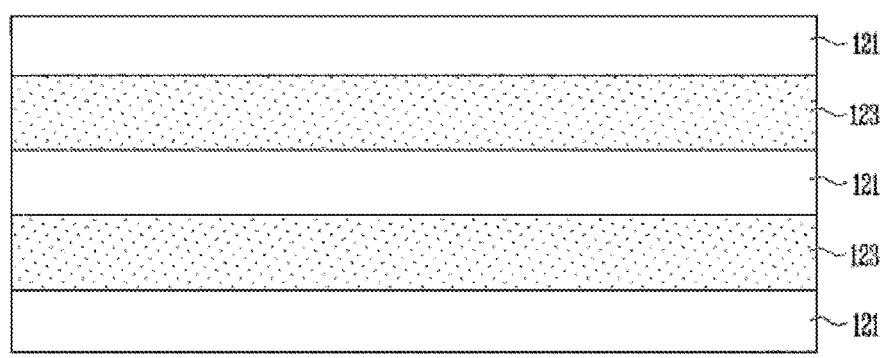
FIGS. 3A through 3E are cross-sectional views illustrating a method of manufacturing the semiconductor device shown in FIG. 1.

Referring to FIG. 3A, a plurality of first material layers 121 and a plurality of second material layers 123 may be alternately formed on a semiconductor substrate (not shown) having a common source line. Also, the first material layers 121 and the second material layers 123 may be formed to have the same thickness or different thicknesses.

Here, the first material layers 121 may be formed of a material having a high etch selectivity with respect to the second material layers 123. For example, the first material layers 121 may be formed of an insulating layer, such as an oxide layer, and the second material layers 123 may be formed of a sacrificial layer, such as a nitride layer. Also, the first material layers 121 may be formed of an insulating layer, such as an oxide layer, and the second material layers 123 may be formed of a conductive material, such as a polycrystalline silicon (poly-Si) layer. Furthermore, the first material layers 121 may be formed of an undoped poly-Si layer, and the second material layers 123 may be formed of a doped poly-Si layer.

Figure 3B:
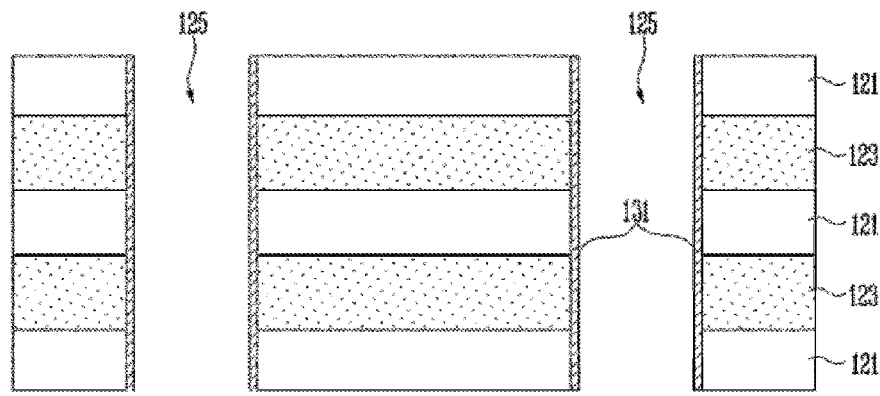

Referring to FIG. 3B, the first material layers 121 and the second material layers 123 may be etched to form holes 125 through the first material layers 121 and the second material layers 123. Thereafter, a charge storage layer 131 may be formed along a sidewall of each of the holes 125. The charge storage layer 131 may be formed of a nitride layer.

Figure 3C:
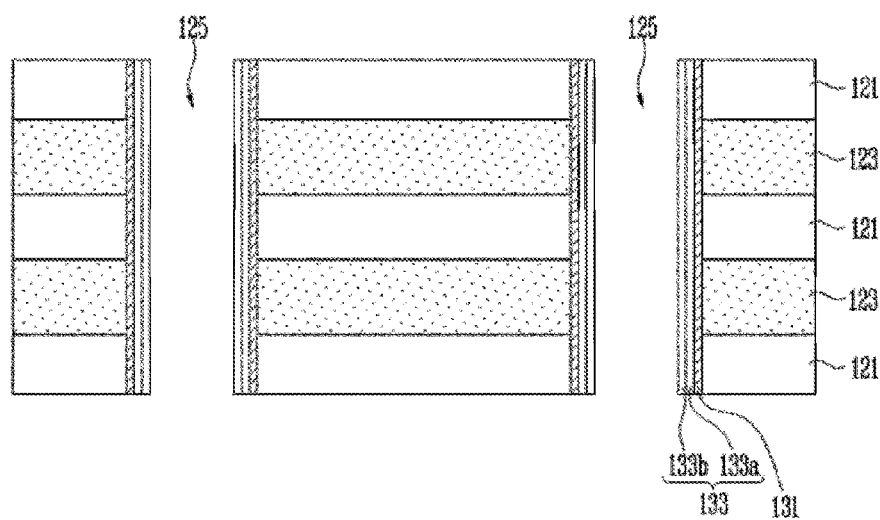

Referring to FIG. 3C, the first tunnel insulating layer 133a and the second tunnel insulating layer 133b may be sequentially stacked on the surface of the charge storage layer 131. The first tunnel insulating layer 133a may be formed of a thermal oxide layer. The second tunnel insulating layer 133b may be formed by stacking a poly-Si layer or a nitride layer on the surface of the first tunnel insulating layer 133a and performing a radical oxidation process. During an oxidation process for forming the second tunnel insulating layer 133b, the first tunnel insulating layer 133a formed of a thermal oxide layer may prevent a SiON layer from being formed on the surface of the charge storage layer 131.

In addition, the second tunnel insulating layer 133b may be formed by performing a dry oxidation process or a wet oxidation process after forming the first tunnel insulating layer 133a. The second tunnel insulating layer 133b may be formed by selectively performing the above-described radical oxidation process, dry oxidation process, and wet oxidation process at the same time.

Figure 3D:
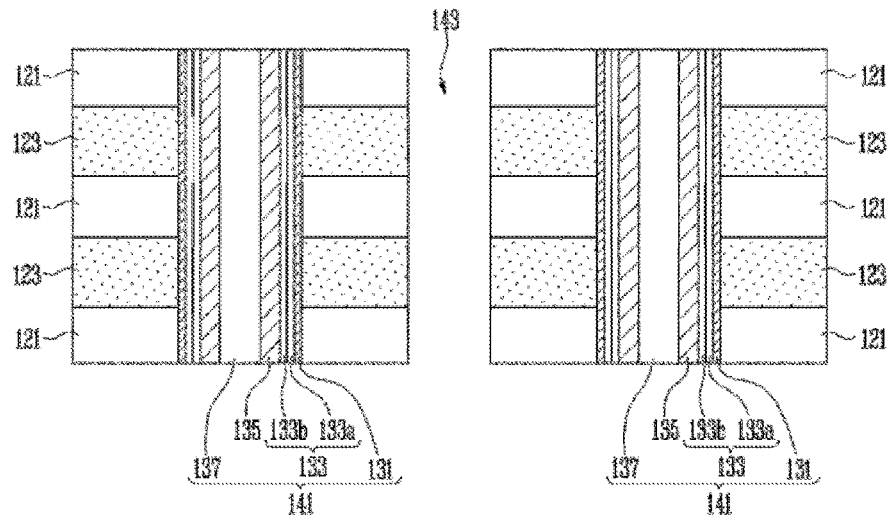

Referring to FIG. 3D, the channel layer 135 may be formed on the surface of the tunnel insulating layer 133 consisting of the first and second tunnel insulating layers 133a and 133b. The channel layer 135 may be formed of a semiconductor layer, such as silicon. The channel layer 135 may be formed to fill a central region of each of the holes 125 or formed as a tube type to open the central region of each of the holes 125 as shown. When the channel layer 135 is formed as a tube type, the opened central region of each of the holes 125 may be filled with the insulating layer 137.

Thereafter, the first material layers 121 and the second material layers 123 formed between the holes 125 may be etched to form a slit 143 between the holes 125 through the first material layers 121 and the second material layers 123. Due to the slit 143, line-shaped insulating layers 121 may be defined, and side surfaces of the second material layers 123 may be exposed.

Figure 3E:
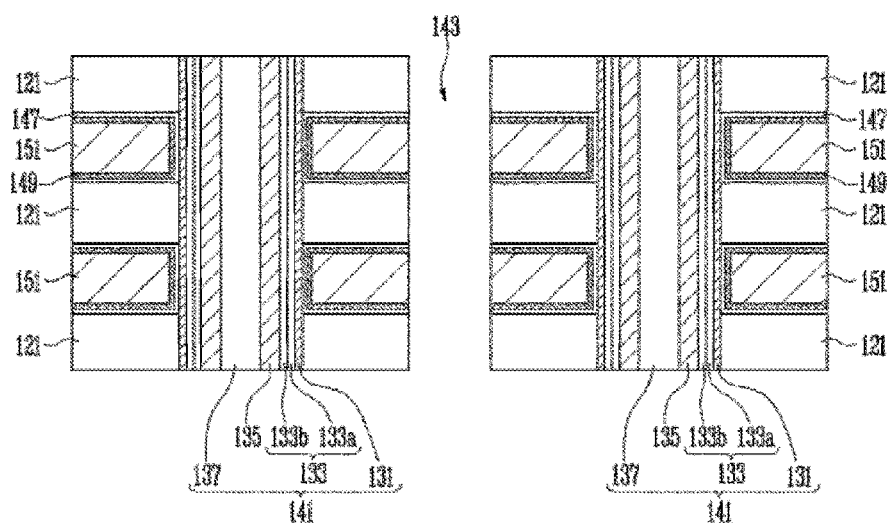

Referring to FIG. 3E, when the first material layers 121 are formed of an insulating layer, such as an oxide layer, and the second material layers 123 are formed of a sacrificial layer, such as a nitride layer, the second material layers 123 exposed through the slit 143 may be selectively removed to form recess regions between the first material layers 121.

Thereafter, the conductive patterns 151 may be formed in the recess regions from which the second material layers 123 are removed. The formation of the conductive patterns 151 may include forming a conductive layer to fill the recess regions and removing the conductive layer formed within the slit 143. The conductive layer may be formed using a doped poly-Si layer, a metal silicide layer, or a metal layer. When the conductive layer is formed using the metal layer, tungsten having a low resistance may be used. In this case, before forming the conductive layer, a barrier layer 149, such as titanium nitride (TiN), may be further formed to prevent diffusion of a metal from the conductive layer. The barrier layer 149 formed within the slit 143 may be removed during the removal of the conductive layer formed within the slit 143.

Meanwhile, before forming the barrier layer 149 and the conductive layer to form the conductive patterns 151, a blocking insulating layer 147 may be further formed along the surfaces of the recess regions.

Thereafter, a known subsequent process, for example, a process of filling the slit 143 with an insulating material, may be performed.

Although not shown, when the first material layers 121 are formed of an insulating layer, such as an oxide layer, and the second material layers 123 are formed of a conductive material, such as a poly-Si layer, the second material layers 123 exposed through the slit 143 may be silicided and utilized as conductive patterns. In this case, the blocking insulating layer 147 may be formed after forming the holes 125 and before forming the charge storage layer 131 during the process step described with reference to FIG. 3B.

Furthermore, although not shown, when the first material layers 121 are formed of an undoped poly-Si layer and the second material layers 123 are formed of a poly-Si layer, the first material layers 121 exposed through the slit 143 may be removed to form recess regions, and the recess regions may be filled with an insulating layer, such as an oxide layer, to form insulating patterns. The second material layers 123 may be used as conductive patterns.

As described above, in the embodiments of the present invention, the tunnel insulating layer 133 may be formed to have a multilayered structure, and the first tunnel insulating layer 133a in contact with the charge storage layer 131 may be formed of a thermal oxide layer. As a result, a SiON layer may be prevented from being formed at an interface between the first tunnel insulating layer 133a and the charge storage layer 131 during an oxidation process for forming the second tunnel insulating layer 133b, thereby improving device characteristics.

Figure 4:
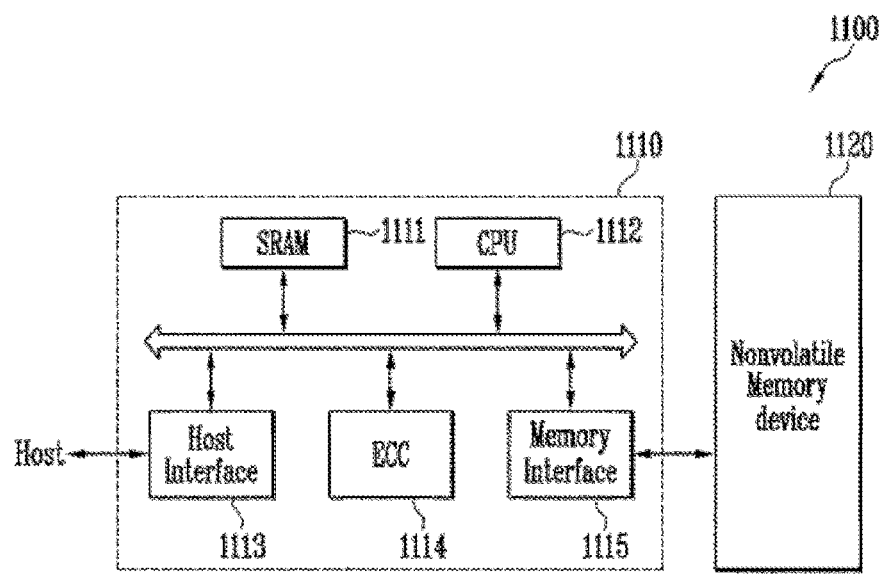
FIG. 4 is a construction diagram of a memory system according to an example of an embodiment of the present invention.

FIG. 4 is a construction diagram of a memory system 1100 according to an example of an embodiment of the present invention.

Referring to FIG. 4, the memory system 1100 according to the embodiments of the present invention may include a nonvolatile memory device 1120 and a memory controller 1110.

The nonvolatile memory device 1120 may include a semiconductor device described in the foregoing embodiments with reference to FIGS. 1 through 3E. That is, the nonvolatile memory device 1120 may include a semiconductor device in which a tunnel insulating layer of a memory cell includes a thermal oxide layer and a radical oxide layer. Thus, cycling characteristics and retention characteristics of the nonvolatile memory device 1120 may be improved. Also, the nonvolatile memory device 1120 may be a multi-chip package including a plurality of flash memory chips.

The memory controller 1110 may be configured to control the nonvolatile memory device 1120 and include a static random access memory (SRAM) 1111, a central processing unit (CPU) 1112, a host interface 1113, an error correction circuit (ECC) 1114, and a memory interface 1115. The SRAM 1111 may be used as an operation memory of the CPU 1112, and the CPU 1112 may perform general control operations for exchanging data of the memory controller 1110. The host interface 1113 may include a data exchange protocol of a host connected to the memory system 1100. Also, the ECC 1114 may detect and correct errors included in data read from the nonvolatile memory device 1120, and the memory interface 1115 may interface with the nonvolatile memory device 1120. In addition, the memory controller 1110 may further include a read-only memory (ROM) configured to store code data required for interfacing with the host.

The memory system 1100 having the above-described construction may be a memory card or solid-state disk (SSD) in which the nonvolatile memory device 1120 is combined with the memory controller 1110. For instance, when the memory system 1100 is an SSD, the memory controller 1110 may communicate with the outside (e.g., the host) through one of various interface protocols, such as a universal serial bus (USB), a multimedia card (MMC), peripheral component interface-express (PCI-E), serial advanced technology attachment (SATA), parallel-ATA (PATA), a small computer system interface (SCSI), an enhanced small device interface (ESDI), and an integrated drive electronics (IDE).

Figure 5:
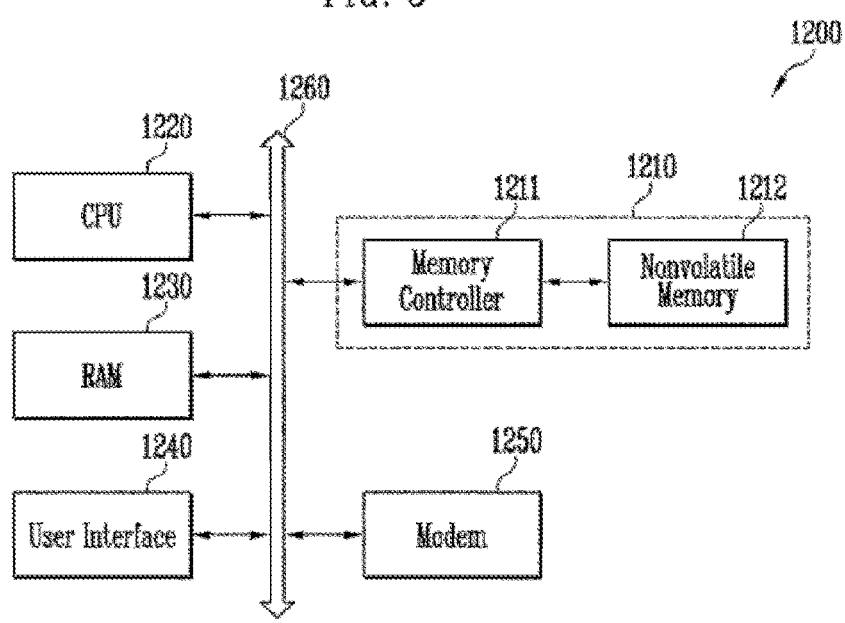
FIG. 5 is a construction diagram of a computing system according to an example of an embodiment of the present invention.

FIG. 5 is a construction diagram of a computing system 1200 according to an example of an embodiment of the present invention.

Referring to FIG. 5, the computing system 1200 according to the embodiments of the present invention may include a CPU 1220, an RAM 1230, a user interface 1240, a modem 1250, and a memory system 1210, which may be electrically connected to a system bus 1260. Also, when the computing system 1200 is a mobile device, the computing system 1200 may further include a battery configured to supply an operation voltage to the computing system 1200. Also, the computing system 1200 may further include an application chipset, a camera image processor (CIS), and a mobile dynamic RAM (mobile DRAM).

As described above with reference to FIG. 4, the memory system 1210 may include a nonvolatile memory 1212 and a memory controller 1211.

According to examples of the embodiments of the present invention, a tunnel insulating layer of a semiconductor device having a 3-dimensional structure can be formed to have a multilayered structure, thereby improving film quality.

Furthermore, the tunnel insulating layer in contact with a charge storage layer of the semiconductor device can be formed of a thermal oxide layer, thereby improving interface characteristics.

In the drawings and specification, there have been disclosed various embodiments of the invention and, although specific terms are employed, they are used in a generic and descriptive sense only and not for purposes of limitation. As for the scope of the invention, it is to be set forth in the following claims. Therefore, it will be understood by those of ordinary skill in the art that various changes in form and details may be made therein without departing from the spirit and scope of the present invention as defined by the following claims.

What is claimed is:

1. A semiconductor memory device comprising: insulating patterns and conductive patterns stacked alternately; a channel layer formed through the insulating patterns and the conductive patterns; a tunnel insulating layer formed to surround sidewalls of the channel layer; a charge storage layer formed to surround the tunnel insulating layer; and a blocking insulating layer formed to surround the charge storage layer, wherein the tunnel insulating layer includes a first tunnel insulating layer formed of a thermal oxide layer and a second tunnel insulating layer formed between the first tunnel insulating layer and the channel layer, wherein a surface of the first tunnel insulating layer is in contact with the charge storage layer.

2. The device of claim 1, wherein the second tunnel insulating layer includes a radical oxide layer.

3. The device of claim 1, wherein the second tunnel insulating layer is formed of at least one of a radical oxide layer, a dry oxide layer, and a wet oxide layer.

4. The device of claim 1, wherein the thermal oxide layer is formed between the charge storage layer and the second tunnel insulating layer to prevent a SiON layer from being formed on the surface of the charge storage layer due to the second tunnel insulating layer.

5. A semiconductor memory device comprising: insulating patterns and conductive patterns stacked alternately; a channel layer formed through the insulating patterns and the conductive patterns; a first tunnel insulating layer formed to surround sidewalls of the channel layer; a second tunnel insulating layer formed to surround the first tunnel insulating layer; a charge storage layer formed to surround the second tunnel insulating layer; and a blocking insulating layer formed to surround the charge storage layer, wherein the second tunnel insulating layer includes a thermal oxide layer, and a surface of the second tunnel insulating layer is in contact with the charge storage layer.

6. The device of claim 5, wherein the first tunnel insulating layer includes a radical oxide layer.

7. The device of claim 5, wherein the first tunnel insulating layer is formed of at least one of a radical oxide layer, a dry oxide layer, and a wet oxide layer.

8. The device of claim 5, wherein the second tunnel insulating layer is formed to prevent a SiON layer from being formed on the surface of the charge storage layer due to the first tunnel insulating layer.

9. A method of manufacturing a semiconductor memory device, the method comprising: alternately stacking first material layers and second material layers; forming holes through the first material layers and the second material layers; forming a charge storage layer, a tunnel insulating layer including a multilayered structure, and a channel layer within each of the holes; forming a slit between the holes through the first material layers and the second material layers; removing the second material layers exposed through the slit to form recess regions; forming a blocking insulating layer on a surface of the charge storage layer exposed by removing the second material layer; and forming a conductive pattern on the blocking insulating layer within the recess regions, wherein the forming of the tunnel insulating layer including the multilayered structure comprises: forming a thermal oxide layer on the charge storage layer; and forming a radical oxide layer on the thermal oxide layer, wherein a surface of the thermal oxide layer is in contact with the charge storage layer.

10. The method of claim 9, wherein the multilayered structure includes the thermal oxide layer and at least one of the radical oxide layer, a dry oxide layer, and a wet oxide layer.

11. The method of claim 9, wherein forming the radical oxide layer on the thermal oxide layer comprises:
using the thermal oxide layer to prevent a layer from being formed between the charge storage layer and the tunnel insulating layer during the formation of the radical oxide layer.

12. The method of claim 9, wherein forming the radical oxide layer on the thermal oxide layer comprises:
using the thermal oxide layer to prevent a shallow trap layer from being formed between the charge storage layer and the tunnel insulating layer during the formation of the radical oxide layer.

13. The method of claim 9, wherein the forming of the radical oxide layer comprises:
forming a nitride layer or a polysilicon (poly-Si) layer on the thermal oxide layer; and
performing a radical oxidation process on the nitride layer or the poly-Si layer.

14. The method of claim 13, wherein the thermal oxide layer prevents a SiON layer from being formed at an interface between the charge storage layer and the tunnel insulating layer during the radical oxidation process.

15. The method of claim 13, further comprising:
using the thermal oxide layer to prevent a shallow trap layer from being formed at an interface between the charge storage layer and the tunnel insulating layer during the radical oxidation process.

* * * * *